United States Patent
Okabe

(10) Patent No.: US 8,944,095 B2
(45) Date of Patent: Feb. 3, 2015

(54) GAS SUPPLY APPARATUS FOR SEMICONDUCTOR MANUFACTURING APPARATUS

(75) Inventor: Tsuneyuki Okabe, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 746 days.

(21) Appl. No.: 13/094,202

(22) Filed: Apr. 26, 2011

(65) Prior Publication Data

US 2011/0265895 A1    Nov. 3, 2011

(30) Foreign Application Priority Data

Apr. 30, 2010    (JP) ................................ 2010-105611

(51) Int. Cl.
  *G05D 7/06*    (2006.01)
  *C23C 16/52*    (2006.01)
  *C23C 16/00*    (2006.01)
  *C23C 16/455*    (2006.01)

(52) U.S. Cl.
  CPC .............. *C23C 16/52* (2013.01); *G05D 7/0617* (2013.01); *C23C 16/00* (2013.01); *C23C 16/45561* (2013.01)
  USPC .......................... 137/486; 137/487.5; 137/597

(58) Field of Classification Search
  CPC .  G05D 7/0641; G05D 7/0647; G05D 7/0652; G05D 7/0658; G05D 7/0664; F16K 11/22
  USPC .................. 137/486, 487.5, 883, 597, 565.26
  See application file for complete search history.

(56) References Cited

U.S. PATENT DOCUMENTS

| | | | | |
|---|---|---|---|---|
| 3,905,394 | A | * | 9/1975 | Jerde ......................... 137/599.04 |
| 4,030,523 | A | * | 6/1977 | Cram et al. .............. 137/599.07 |
| 4,644,967 | A | * | 2/1987 | Wyatt et al. .............. 137/599.05 |
| 5,329,965 | A | * | 7/1994 | Gordon .................... 137/599.07 |
| 5,865,205 | A | * | 2/1999 | Wilmer .............................. 137/2 |
| 6,210,482 | B1 | * | 4/2001 | Kitayama et al. .............. 118/715 |
| 6,216,726 | B1 | * | 4/2001 | Brown et al. ................. 137/486 |

(Continued)

FOREIGN PATENT DOCUMENTS

JP       2000-323464  A1    11/2000
WO     WO 2007001041  A1  *   1/2007

OTHER PUBLICATIONS

Chinese Office Action, Chinese Application No. 201110109144.7, dated Jan. 15, 2014 (4 pages).

*Primary Examiner* — William McCalister
(74) *Attorney, Agent, or Firm* — Burr & Brown, PLLC

(57) ABSTRACT

There is provided a gas supply apparatus 10 which does not necessitate installation of a pressure type flow controller for each processing reactor and which enables a compact construction of the flow controller. The gas supply apparatus 10 includes gas supply sources 11a, 11b, gas introduction pipes 13a, 13b, a main gas pipe 15, and branch pipes 21a, 21b. A pressure type flow controller 30 is provided for the main gas pipe 15 and the branch pipes 21a, 21b. The pressure type flow controller 30 includes a pressure detector 17 provided in the main gas pipe 15, and control valves 23a, 23b and orifices 22a, 22b, both provided in the branch pipes 21a, 21b. An arithmetic circuit 40 determines a flow rate Qc based on a detected pressure $P_1$ from the pressure detector 17, and an arithmetic control circuit 58 controls the control valves 23a, 23b based on a set flow rate signal Qs from a flow rate setting circuit 52 and on the flow rate Qc from the arithmetic circuit 40.

6 Claims, 9 Drawing Sheets

(56) References Cited

U.S. PATENT DOCUMENTS

| | | | |
|---|---|---|---|
| 6,333,272 B1 * | 12/2001 | McMillin et al. | 438/710 |
| 6,360,762 B2 * | 3/2002 | Kitayama et al. | 137/1 |
| 6,418,954 B1 * | 7/2002 | Taylor et al. | 137/9 |
| 6,422,264 B2 * | 7/2002 | Ohmi et al. | 137/487.5 |
| 6,508,913 B2 * | 1/2003 | McMillin et al. | 156/345.29 |
| 6,532,978 B1 * | 3/2003 | Muller-Kuhrt et al. | 137/1 |
| 6,578,435 B2 * | 6/2003 | Gould et al. | 73/861.52 |
| 6,581,623 B1 * | 6/2003 | Carpenter et al. | 137/113 |
| 6,655,408 B2 * | 12/2003 | Linthorst | 137/487.5 |
| 6,766,260 B2 * | 7/2004 | Ambrosina et al. | 702/45 |
| 6,799,603 B1 * | 10/2004 | Moore | 137/597 |
| 7,004,191 B2 * | 2/2006 | Shajii et al. | 137/487.5 |
| 7,143,774 B2 * | 12/2006 | Lull et al. | 137/9 |
| 7,360,551 B2 * | 4/2008 | Lull et al. | 137/9 |
| 7,424,894 B2 * | 9/2008 | Lull et al. | 137/9 |
| 8,418,714 B2 * | 4/2013 | Ohmi et al. | 137/486 |
| 2001/0013363 A1 * | 8/2001 | Kitayama et al. | 137/7 |
| 2004/0168719 A1 * | 9/2004 | Nambu | 137/87.04 |
| 2005/0199342 A1 * | 9/2005 | Shajii et al. | 156/345.26 |
| 2008/0093023 A1 | 4/2008 | Tomita et al. | |
| 2010/0269924 A1 * | 10/2010 | Yasuda | 137/488 |
| 2011/0135821 A1 * | 6/2011 | Ding | 427/248.1 |

\* cited by examiner

GAS SUPPLY APPARATUS FOR SEMICONDUCTOR MANUFACTURING APPARATUS

CROSS REFERENCE TO RELATED APPLICATIONS

This application is based upon the prior Japanese Patent Application No. 2010-105611 filed on Apr. 30, 2010, the entire contents of which are incorporated herein by reference.

BACKGROUND OF THE INVENTION

1. Field of the Invention

The present invention relates to a gas supply apparatus for the manufacturing of a semiconductor, and more particularly to a gas supply apparatus for a semiconductor manufacturing apparatus, which enables downsizing of the gas supply apparatus and reduction in the production cost of the apparatus.

2. Description of the Background Art

In the manufacturing of semiconductors, it is common practice to use a wide variety of gases in a switching manner or use the same type of gases in parallel at different flow rates. Therefore, in a conventional gas supply apparatus for a semiconductor manufacturing apparatus, a flow controller such as a mass flow controller is provided for each of gas systems, to which gases are to be supplied, so as to control the flow rates of the supply gases with high accuracy.

For example, an etching process, one of the main processes in the manufacturing of a semiconductor, is generally carried out in multiple steps in which a plurality of insulating films are etched sequentially. In each etching step, etching is carried out by using three or four types of gases in combination. Accordingly, a total of at least ten types of gases and flow controllers are needed only for a gas supply apparatus for the etching process. A huge number of flow controllers are necessary for the entire semiconductor manufacturing facility.

In the case of a CVD process, the process is sometimes carried out by simultaneously supplying the same type of gases from a plurality of supply ports into a processing reactor at the same or different flow rates. A flow controller is generally provided in a line connecting with each supply port to control the flow rate of the supply gas. Thus, a large number of flow controllers are needed in total.

While mass flow controllers have most commonly been used thus far, pressure type flow controllers have been developed in recent years. However, when a large number of flow controllers are installed in a gas supply apparatus as described above, the gas supply apparatus should necessarily be large-sized one and involve high costs for its production and maintenance. Furthermore, the installation of a large number of flow controllers makes the maintenance of the flow controllers troublesome and time-consuming and, in addition, necessitates a large number of replacement parts and spare parts, thus incurring high running cost for the gas supply apparatus.

PATENT DOCUMENT

Patent document 1: Japanese Patent Laid-Open Publication No. 2000-323464

SUMMARY OF THE INVENTION

The present invention has been made in view of the above situation. It is therefore an object of the present invention to provide a gas supply apparatus for a semiconductor manufacturing apparatus, which does not necessitate installation of a flow controller for every processing reactor and which enables a compact construction of the flow controller.

In order to achieve the object, the present invention provides a gas supply apparatus for supplying a gas to a plurality of processing reactors of a semiconductor manufacturing apparatus, comprising: a plurality of gas supply sources; gas introduction pipes respectively connected to the gas supply sources; a main gas pipe into which the gas introduction pipes converge; branch pipes branching off the main gas pipe and respectively connected to the processing reactors; and a pressure type flow controller provided for the main gas pipe and the branch pipes, wherein the pressure type flow controller includes a pressure detector provided in the main gas pipe, a control valve provided in each of the branch pipes, an orifice provided downstream or upstream of the control valve, an arithmetic circuit for determining a flow rate $Qc=KP_1$ (K is a constant) from a detected pressure $P_1$ from the pressure detector, a flow rate setting circuit for outputting a set flow rate signal Qs, and an arithmetic control circuit for controlling the control valves based on the flow rate Qc from the arithmetic circuit and on the set flow rate signal Qs from the flow rate setting circuit.

In a preferred embodiment of the present invention, the pressure type flow controller further includes a flow detecting thermal sensor provided in the main gas pipe, and a signal Qa from the thermal sensor is sent to the arithmetic control circuit and the arithmetic control circuit determines whether the flow velocity of the gas passing through the orifice falls within the supersonic range.

In a preferred embodiment of the present invention, a bypass pipe is connected to the gas introduction pipe of a particular gas supply source of the plurality of gas supply sources, and the bypass pipe and each of the branch pipes are connected by a communication pipe.

In a preferred embodiment of the present invention, the branch pipes are connected to cluster-type single-wafer processing reactors.

In a preferred embodiment of the present invention, the branch pipes are connected to batch processing reactors.

In a preferred embodiment of the present invention, the pressure type flow controller further includes an electricity/air pressure regulator provided between the arithmetic control circuit and the control valves.

According to the present invention, there is no need to provide a pressure type flow controller for each processing reactor; the present invention enables a very compact construction of the pressure type flow controller.

DETAILED DESCRIPTION OF THE INVENTION

First Embodiment

A gas supply apparatus for a semiconductor manufacturing apparatus according to a first embodiment of the present invention will now be described with reference to the drawings.

Figure 1:
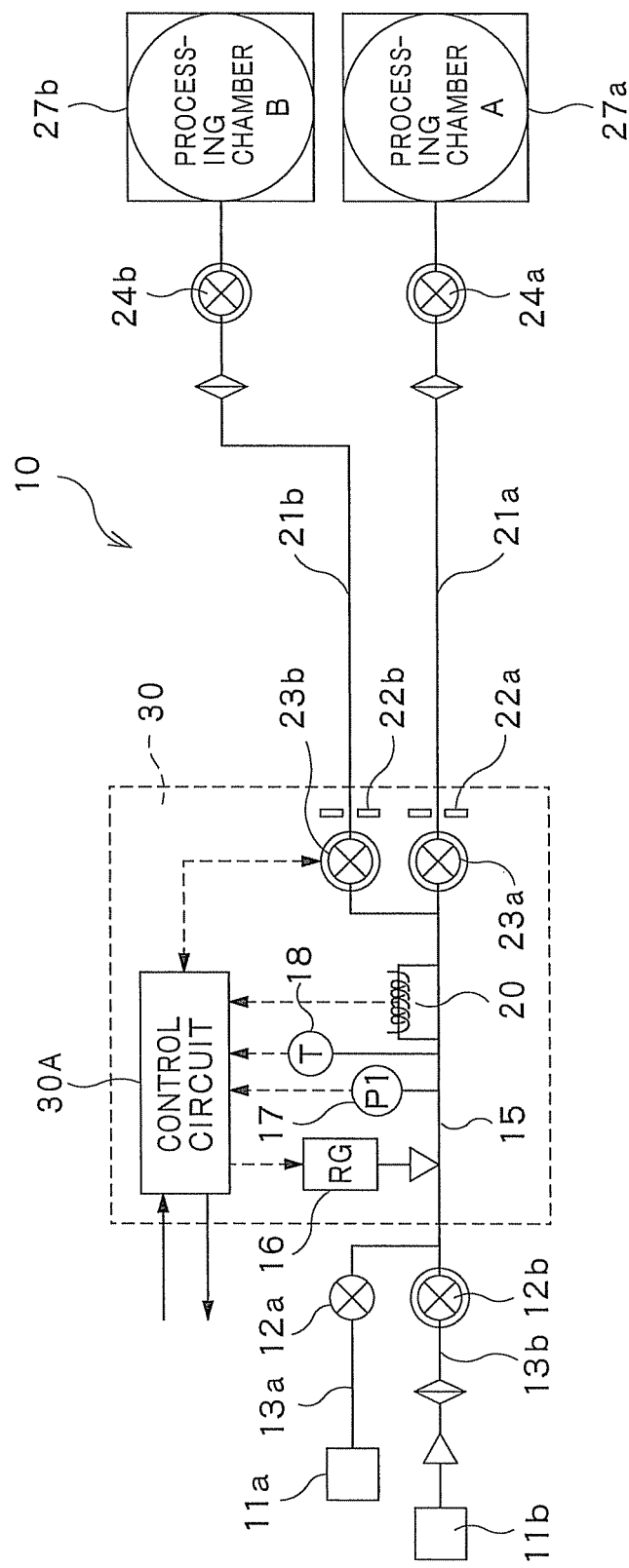
FIG. 1 is a schematic systematic diagram showing a gas supply apparatus for a semiconductor manufacturing apparatus according to a first embodiment of the present invention.
Figure 2:
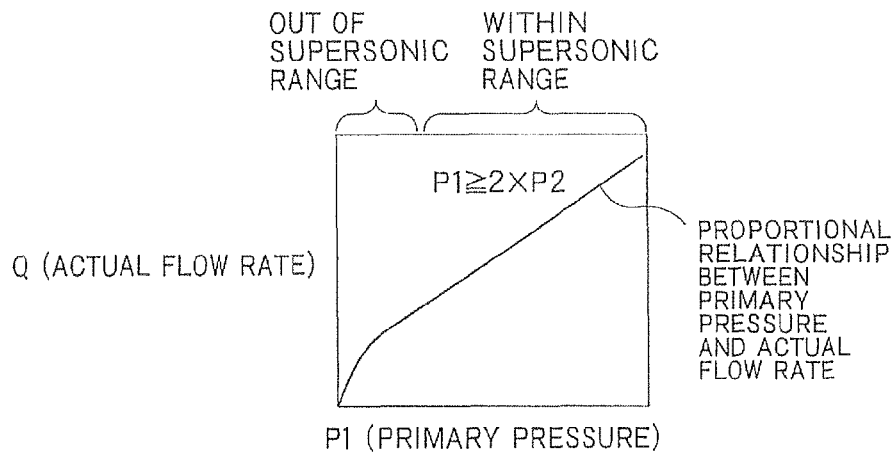
FIG. 2 is a diagram showing the relationship between a primary pressure and an actual flow rate.
Figure 3:
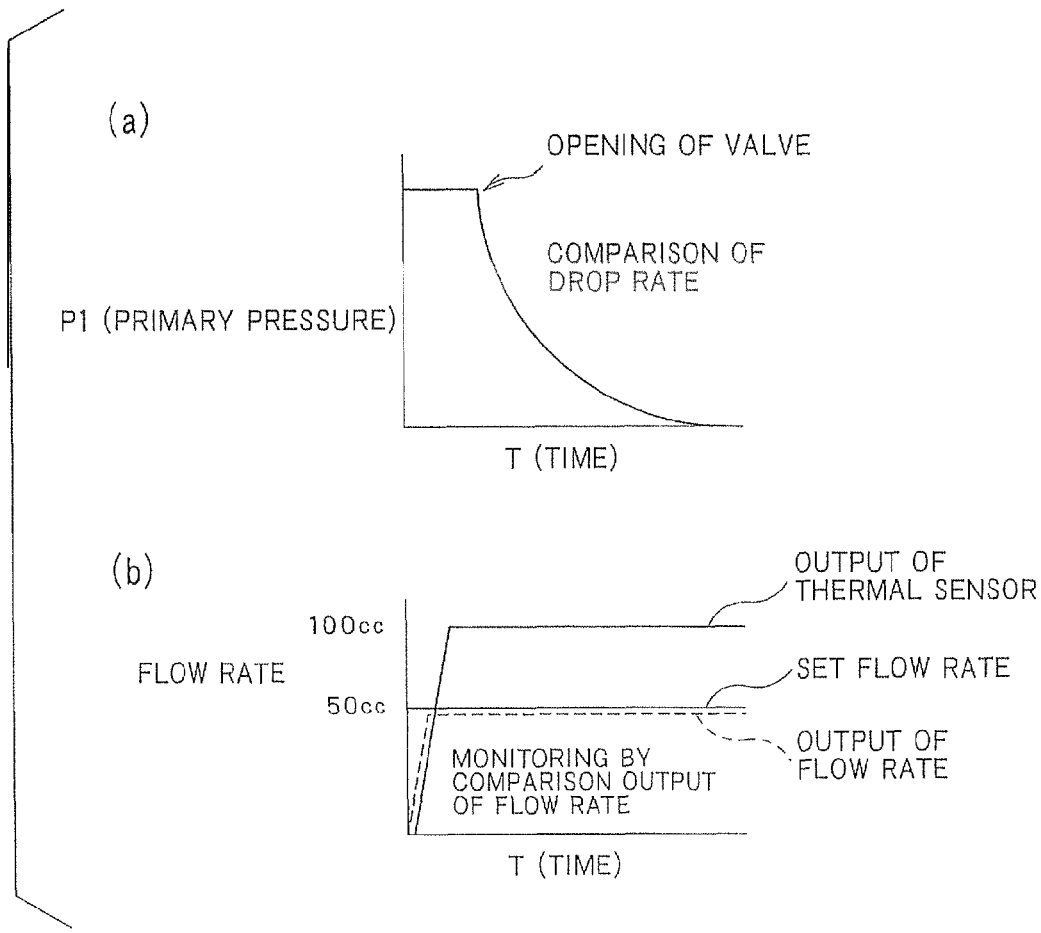
FIG. 3(a) is a diagram showing a primary pressure as observed when a control valve is opened.
FIG. 3(b) is a diagram showing a flow rate as detected by a pressure detector and a flow rate as detected by a thermal sensor.
Figure 4:
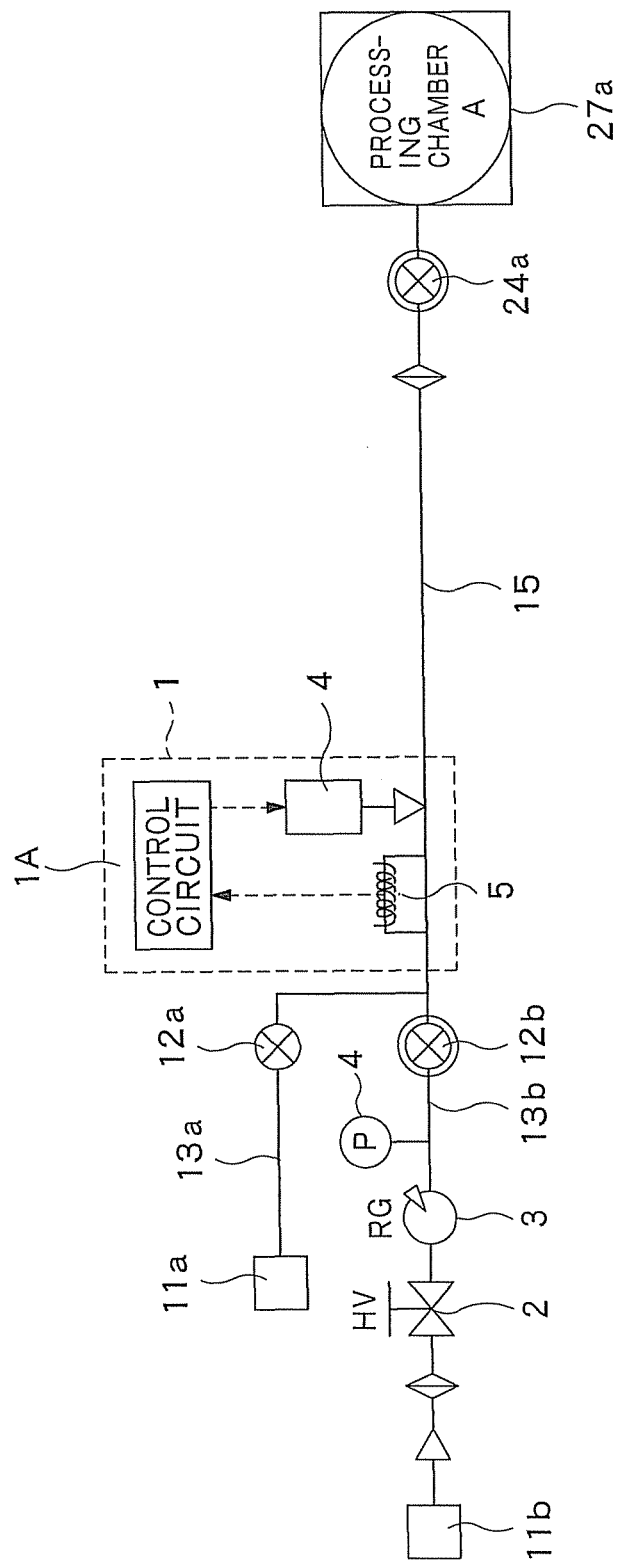
FIG. 4 is a diagram showing a comparative gas supply apparatus for a semiconductor manufacturing apparatus.
Figure 5:
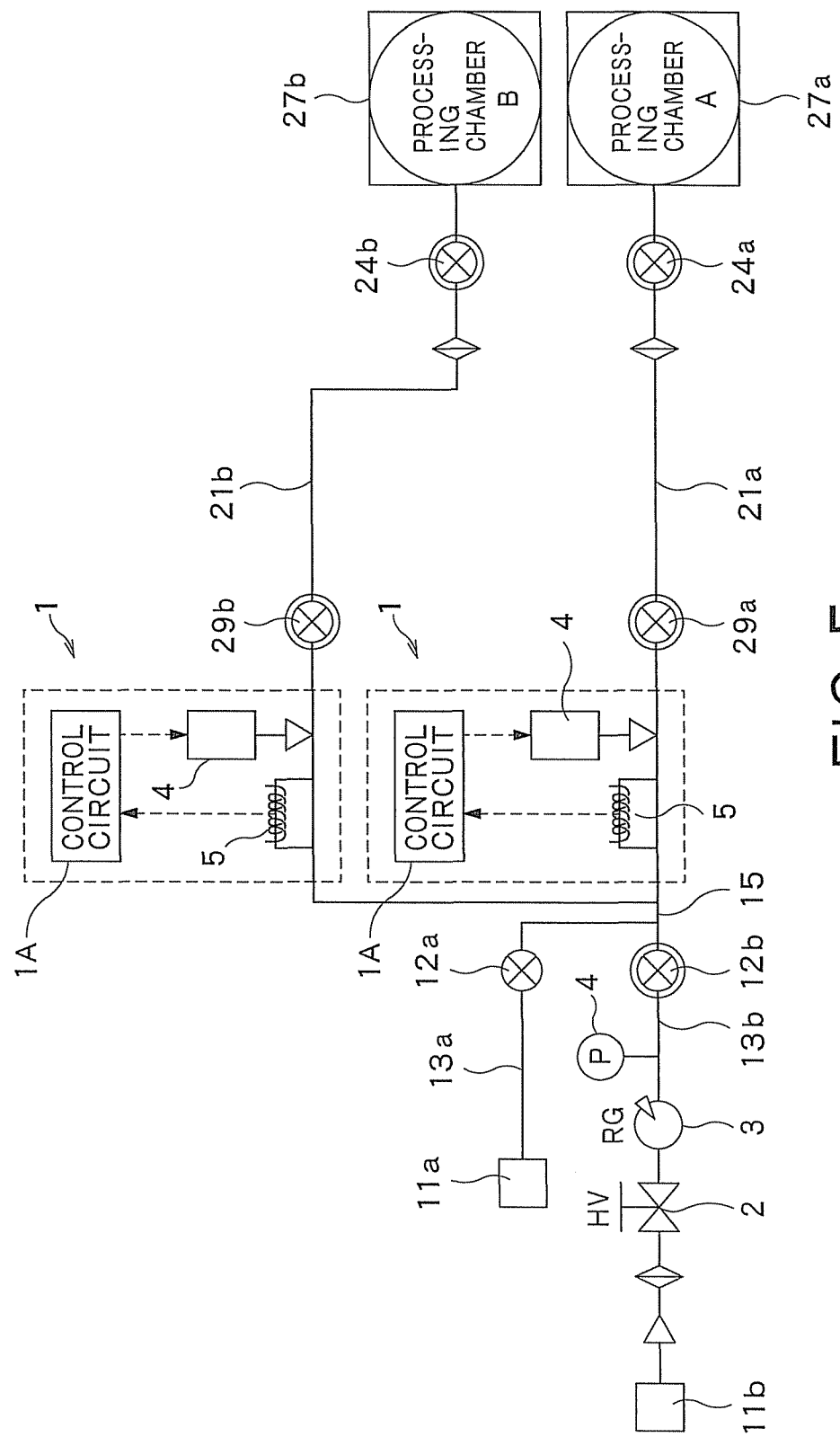
FIG. 5 is a diagram showing another comparative gas supply apparatus for a semiconductor manufacturing apparatus.
Figure 6:
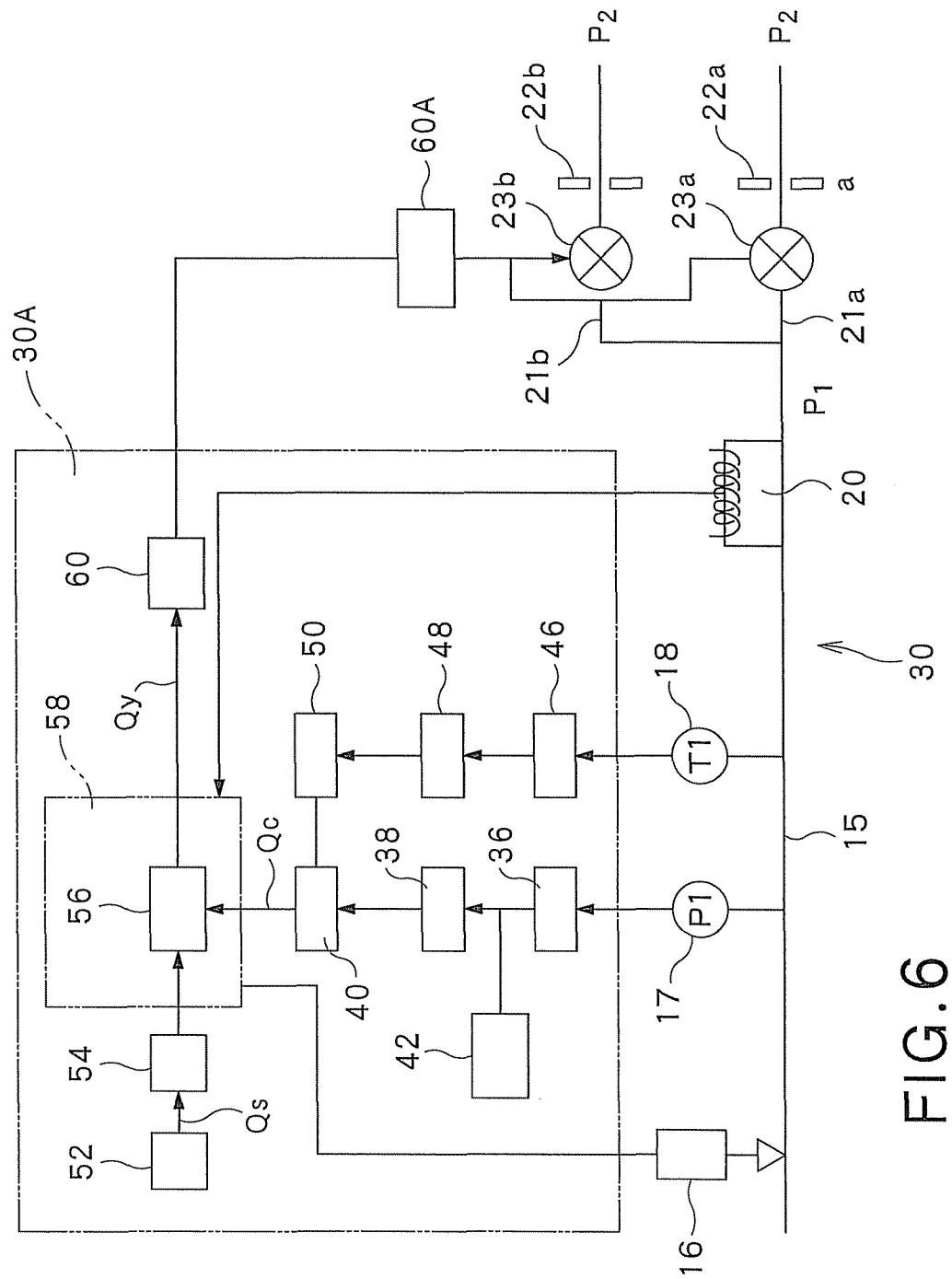
FIG. 6 is a diagram showing the details of a pressure type flow controller.

FIGS. 1 through 6 are diagrams showing a gas supply apparatus for a semiconductor manufacturing apparatus according to a first embodiment of the present invention. In particular, FIG. 1 is a schematic systematic diagram showing the gas supply apparatus for a semiconductor manufacturing apparatus; FIG. 2 is a diagram showing the relationship between a primary pressure and an actual flow rate; FIGS. 3(a) and 3(b) are diagrams illustrating abnormality monitoring of an orifice, FIG. 3(a) being a diagram showing a primary pressure as observed when a control valve is opened, and FIG. 3(b) being a diagram showing a flow rate as detected by a pressure detector and a flow rate as detected by a thermal sensor; FIG. 4 is a diagram showing a comparative gas supply apparatus for a semiconductor manufacturing apparatus; FIG. 5 is a diagram showing another comparative gas supply apparatus for a semiconductor manufacturing apparatus; and FIG. 6 is a diagram showing the details of a pressure type flow controller.

As shown in FIGS. 1 through 6, the gas supply apparatus 10 for a semiconductor manufacturing apparatus is to supply a gas to processing reactors 27a, 27b. The processing reactors 27a, 27b may be batch processing reactors (processing chambers) capable of simultaneously processing a large number of wafers. Semiconductors, including FPDs, LEDs and PV (photovoltaic) cells, can be produced by such processing reactors 27a, 27b.

The gas supply apparatus 10 for a semiconductor manufacturing apparatus includes gas supply sources 11a, 11b, gas introduction pipes 13a, 13b respectively connected to the gas supply sources 11a, 11b, a main gas pipe 15 into which the gas introduction pipes 13a, 13b converge, branch pipes 21a, 21b branching off the main gas pipe 15 and respectively connected to the processing reactors (chambers) 27a, 27b, and a pressure type flow controller 30 comprehensively provided for the main gas pipe 15 and the branch pipes 21a, 21b.

The gas supply source 11a may be exemplified by an inert gas supply source, and the gas supply source 11b may be exemplified by a processing gas supply source.

The gas introduction pipes 13a, 13b from the gas supply sources 11a, 11b are provided with gas supply valves 12a, 12b, respectively, and the branch pipes 21a, 21b are provided with on-off valves 24a, 24b, respectively.

The pressure type flow controller 30 will now be described in detail with reference to FIGS. 1 and 6. As shown in FIGS. 1 and 6, the pressure type flow controller 30 includes a pressure detector 17 provided in the main gas pipe 15, control valves 23a, 23b respectively provided in the branch pipes 21a, 21b, orifices 22a, 22b respectively provided downstream of the control valves 23a, 23b, and a control circuit 30A for driving and controlling the control valves 23a, 23b based on a detected pressure $P_1$ from the pressure detector 17. The orifices 22a, 22b may be provided upstream of the control valves 23a, 23b.

The main gas pipe 15 is provided with a flow regulator 16 disposed upstream of the pressure detector 17, and a temperature detector 18 and a flow detecting thermal sensor 20, both disposed downstream of the pressure detector 17.

The pressure type flow controller 30 will now be described in greater detail with reference to FIG. 6.

FIG. 6 shows the construction of the system of the pressure type flow controller 30. Referring to FIG. 6, the flow velocity of a gas, passing through the orifices 22a, 22b, generally reaches sonic velocity when the gas pressure ratio $P_2/P_1$ ($P_1$: upstream-side pressure, $P_2$: downstream-side pressure) before and after the orifices 22a, 22b is lower than the critical pressure ratio of the gas (about 0.5 for air, nitrogen gas, or the like), and a change in the gas pressure downstream of the orifices 22a, 22b will not be transmitted to the upstream side, and therefore a stable mass flow rate, corresponding to the state of the gas upstream of the orifices 22a, 22b, can be attained. Thus, when the upstream-side pressure $P_1$ is set more than about twice the downstream-side pressure $P_2$, the downstream-side flow rate Qc of the gas, flowing downstream of the orifices 22a, 22b, depends only on the upstream-side pressure $P_1$ and the following linear relation holds with high accuracy: $Qc=KP_1$ (K is a constant). The constant K is the same for the same diameter of the orifices 22a, 22b (see FIG. 2).

The branch pipes 21a, 21b, lying upstream of the orifices 22a, 22b, are provided with the control valves 23a, 23b which are opened and closed by a drive section 60A, while the branch pipes 21a, 21b, lying downstream of the orifices 22a, 22b, are respectively connected to the processing reactors 27a, 27b via the on-off valves 24a, 24b. The pressure $P_1$ upstream of the orifices 22a, 22b is detected by the pressure detector 17 and displayed on a pressure indicator 42 via an amplifier circuit 36. Further, the output is digitized through an A/D converter 38, and the flow rate Q downstream of the orifices 22a, 22b is calculated by an arithmetic circuit 40 according to the formula: $Q=KP_1$ (K is a constant). The pressure indicator 42 may not necessarily be provided.

On the other hand, the temperature $T_1$ upstream of the orifices 22a, 22b, detected by the temperature detector 18, is outputted, via an amplifier circuit 46 and an A/D converter 48, to a temperature-correction circuit 50 where the flow rate Q is temperature-corrected, and the corrected flow rate Qc is outputted to a comparison circuit 56. The comparison circuit 56 constitutes an arithmetic control circuit 58 for driving and controlling the control valves 23a, 23b.

On the other hand, a set flow rate Qs is outputted from a flow rate setting circuit 52 and sent to the comparison circuit 56 via an A/D converter 54. The comparison circuit 56 calculates a difference signal Qy between the arithmetic flow rate Qc and the set flow rate Qs, Qy=Qc−Qs, and the calculated signal is outputted via an amplifier circuit 60 to the drive section 60A for the control valves 23a, 23b. The drive section 60A controls the opening/closing of the control valves 23a, 23b so that the difference signal Qy becomes zero, i.e. the flow rate downstream of the control valves 23a, 23b becomes equal to the set flow rate.

Because the pressure type flow controller 30 is configured to control the secondary flow rate by regulating the pressure $P_1$ upstream of the orifices 22a, 22b, the flow rate downstream of the orifices 22a, 22b can be controlled without being affected by the gas pressure upstream of the control valves 23a, 23b, and flow rate characteristics with a relatively good linearity can be obtained. Further, by determining flow factors for a reference gas and a reference flow rate in advance, high accuracy flow control can be performed relatively easily also for various different types of gases and different gas flow rates.

The arithmetic control circuit 58 including the comparison circuit 56, the arithmetic circuit 40, the temperature-correction circuit 50, the flow rate setting circuit 52, the A/D converter 54, the amplifier circuit 60, the amplifier circuit 36, the pressure indicator 42, the A/D converter 38, the amplifier circuit 46 and the A/D converter 48 constitute the control circuit 30A.

As shown in FIG. 6, the flow rate in the main gas pipe 15 is detected by the flow detecting thermal sensor 20, and the detected flow rate is sent to the arithmetic control circuit 58.

As shown in FIG. 2, the flow velocity of a gas, passing through the orifices 22a, 22b, generally falls into the supersonic range when the primary pressure $P_1$ and the secondary pressure $P_2$ satisfy the relation: $P_1 \geq 2 \times P_2$. In this case, the flow rate of the gas in the main gas pipe 15 can be appropriately controlled by means of the above-described pressure type flow controller 30. On the other hand, when the primary pressure $P_1$ and the secondary pressure $P_2$ satisfy the relation $P_1 < 2 \times P_2$, the secondary flow velocity falls out of the supersonic range, and it is difficult to control the flow rate of the gas in the main gas pipe 15 by means of the pressure type flow controller 30.

Referring to FIG. 6, the flow rate detected by the thermal sensor 20 is sent to the arithmetic control circuit 58. When the primary pressure $P_1$ is low, such as that immediately after the start of operation, the arithmetic control circuit 58 determines that pressure type flow control is impossible, and starts the above-described pressure type flow control when the primary pressure $P_1$ and the secondary pressure $P_2$ have come to satisfy the relation $P_1 \geq 2 \times P_2$ and the secondary flow velocity has come into the supersonic range.

As shown in FIG. 6, the arithmetic control circuit 58, besides driving and controlling the control valves 23a, 23b, may also control the flow regulator 16 to regulate the pressure and the flow rate in the main gas pipe 15.

The operation of the thus-constructed gas supply apparatus of this embodiment will now be described.

Different gases are respectively supplied from the gas supply sources 11a, 11b to the gas introduction pipes 13a, 13b, and the gases in the gas introduction pipes 13a, 13b are introduced into the main gas pipe 15 and meet there. The mixed gas in the main gas pipe 15 passes through the flow regulator 16, the pressure detector 17, the temperature detector 18 and the flow detecting thermal sensor 20, and flows into the branch pipes 21a, 21b.

The mixed gas introduced into the branch pipes 21a, 21b passes through the control valves 23a, 23b and the orifices 22a, 22b, and is supplied to the corresponding processing reactors (chambers) 27a, 27b.

As described above, according to this embodiment, the pressure type flow controller 30 includes the pressure detector 17; the control valves 23a, 23b provided in the branch pipes 21a, 21b; the orifices 22a, 22b provided downstream of the control valves 23a, 23b; the arithmetic circuit 40 for determining the gas flow rate from a detected pressure from the pressure detector 17; the flow rate setting circuit 52; and the arithmetic control circuit 58 for controlling the control valves 23a, 23b based on a calculated flow rate from the arithmetic circuit 40 and on a set flow rate value from the flow rate setting circuit 52. Thus, the control valves 23a, 23b and the orifices 22a, 22b can be incorporated into the pressure type flow controller 30, making it possible to make the pressure type flow controller 30 compact as a whole.

Further, installation of the single pressure type flow controller 30 suffices for the processing reactors 27a, 27b. This can reduce the production cost of the gas supply apparatus.

Furthermore, because the pressure in the branch pipes 21a, 21b, lying between the orifices 22a, 22b and the processing reactors 27a, 27b, is the secondary pressure $P_2$, there is no need to use a pressure-resistant pipe as the branch pipes 21a, 21b, and thus no increase in the production cost of the gas supply apparatus.

In order to monitor abnormality, such as clogging of the orifices 22a, 22b, abnormality monitoring is periodically performed in this embodiment in the following manner:

For example, as shown in FIG. 3(a), the operation of the gas supply apparatus 10 is stopped periodically. The control valves 23a, 23b are then closed, and the pressure (primary pressure $P_1$) of the mixed gas filling the main gas pipe 15, detected by the pressure detector 17, is kept at a predetermined value. The control valves 23a, 23b are then opened, whereupon the pressure (primary pressure $P_1$) detected by the pressure detector 17 decreases with time. The drop rate of the primary pressure $P_1$ is determined periodically and compared with the initial value of the drop rate before the operation. The orifices 22a, 22b are determined to be clogged when the drop of the primary pressure $P_1$ takes more time than before the operation.

Alternatively, clogging of the orifices 22a, 22b can be monitored by comparing in the arithmetic control circuit 58 the flow rate Qc, determined by the arithmetic circuit 40 of the pressure type flow controller 30, with the flow rate determined by the flow detecting thermal sensor 20 (FIG. 3(b)). Referring to FIG. 3(b), on the premise that the two processing reactors 27a, 27b are provided, the flow rate Qc determined by the arithmetic circuit 40 is for each of the processing reactors 27a, 27b and is about half of the flow rate determined by the thermal sensor 20.

The advantageous effects of the gas supply apparatus for a semiconductor manufacturing apparatus according to the present invention will now be described in comparison with a comparative gas supply apparatus as shown in FIG. 4.

As shown in FIG. 4, the comparative gas supply apparatus includes gas supply sources 11a, 11b, gas introduction pipes 13a, 13b respectively connected to the gas supply sources 11a, 11b, and a main gas pipe 15 into which the gas introduction pipes 13a, 13b converge and which reaches a processing reactor (chamber) 27a. The gas introduction pipe 13a is provided with a gas supply valve 12a, and the gas introduction pipe 13b is provided with an on-off valve 2, a flow regulator 3, a pressure detector 4 and a gas supply valve 12b.

The main gas pipe 15 is provided with a flow controller 1 which includes a flow detecting thermal sensor 5, a flow regulator 4 and a control circuit 1A for controlling the flow regulator 4 based on a detected flow rate from the thermal sensor 5.

The main gas pipe 15 is provided with an on-off valve 24a located downstream of the flow controller 1.

Referring to FIG. 4, the flow regulator 4 is kept closed during a process wait time period to fill the main gas pipe 15 in the flow controller 1 with a gas. Upon the start of process control, the flow regulator 4 of the flow controller 1 is opened to start flow rate control. Because the main gas pipe 15 is filled with the gas, the flow rate of the gas supplied to the processing rector 27a temporarily increases at the start of the flow rate control.

According to the present invention, on the other hand, because of the provision of the orifices 22a, 22b downstream or upstream of the control valves 23a, 23b, there is no temporary increase in the flow rate of the gas supplied to the processing reactors 27a, 27b when starting flow rate control after filling the main gas pipe 15 with the gas by opening the control valves 23a, 24b.

In the comparative gas supply apparatus shown in FIG. 4, the on-off valve 2 and the additional flow regulator 3 are provided, separately from the flow regulator 4 of the flow controller 1, in the gas introduction pipe 13b upstream of the flow controller 1.

According to the present invention, on the other hand, the pressure type flow controller 30 itself is provided with the control valves 23a, 23b and the flow regulator 16. There is, therefore, no need to provide the on-off valve 2 and the additional flow regulator 3 separately from the pressure type flow controller 30.

The present invention will now be described in comparison with another comparative gas supply apparatus as shown in FIG. 5.

As shown in FIG. 5, the comparative gas supply apparatus includes gas supply sources 11a, 11b, gas introduction pipes 13a, 13b respectively connected to the gas supply sources 11a, 11b, a main gas pipe 15 into which the gas introduction pipes 13a, 13b converge, and branch pipes 21a, 21b branching off the main gas pipe 15 and respectively connected to processing reactors (chambers) 27a, 27b. The gas introduction pipe 13a is provided with a gas supply valve 12a, and the gas introduction pipe 13b is provided with an on-off valve 2, a flow regulator 3, a pressure detector 4 and a gas supply valve 12b.

The branch pipes 21a, 21b are each provided with a flow controller 1 which includes a flow detecting thermal sensor 5, a flow regulator 4 and a control circuit 1A for controlling the flow regulator 4 based on a detected flow rate from the thermal sensor 5.

The branch pipe 21a is provided with on-off valves 29a, 24a, and the branch pipe 21b is provided with on-off valves 29b, 24b.

Referring to FIG. 5, the flow controller 1 is provided for each of the two processing reactors 27a, 27b, and thus the number of the flow controllers 1 is two, equal to the number of the processing reactors 27a, 27b.

According to the present invention, on the other hand, the single pressure type flow controller 30 is provided for the two processing chambers 27a, 27b. This can significantly reduce the production cost of the gas supply apparatus.

Second Embodiment

Figure 7:
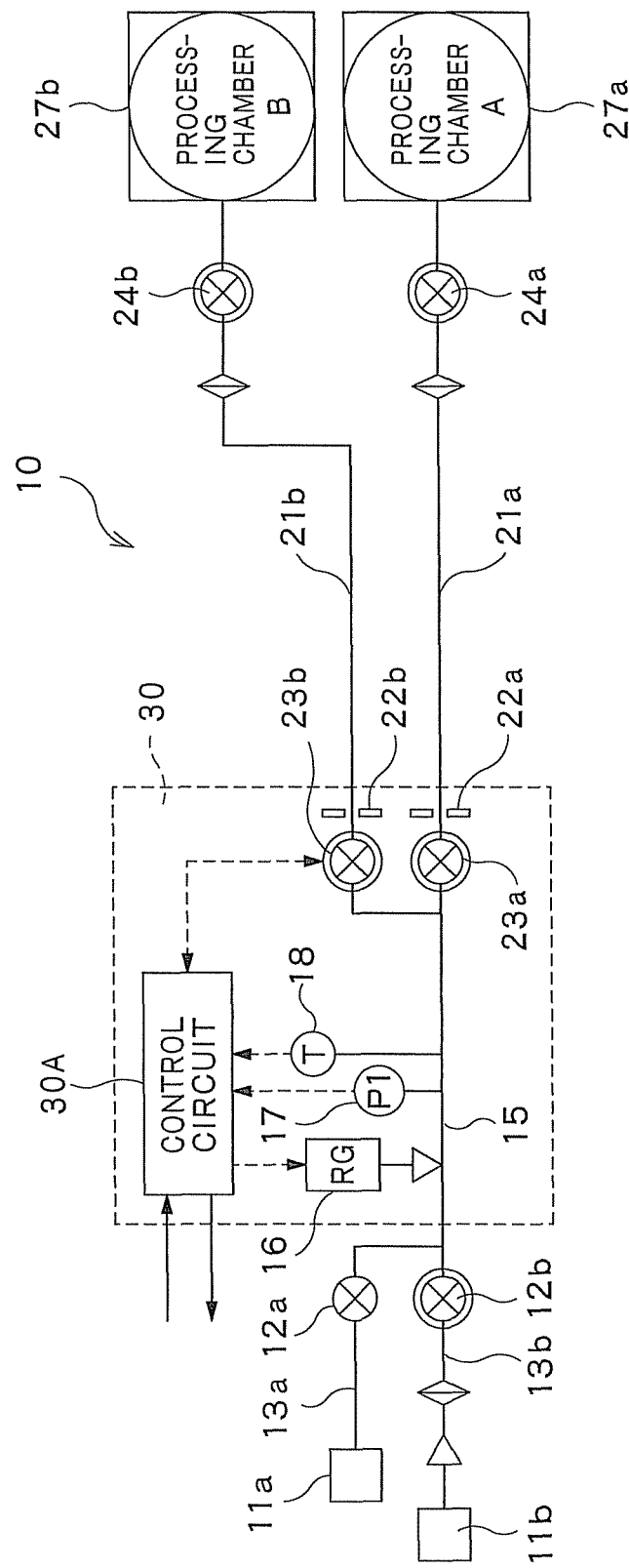
FIG. 7 is a diagram showing a gas supply apparatus for a semiconductor manufacturing apparatus according to a second embodiment of the present invention.

A gas supply apparatus for a semiconductor manufacturing apparatus according to a second embodiment of the present invention will now be described with reference to FIG. 7. The second embodiment shown in FIG. 7 differs from the first embodiment shown in FIGS. 1 through 6 in that the flow detecting thermal sensor is not provided in the second embodiment; the other construction of the second embodiment is substantially the same as the first embodiment.

The gas supply apparatus 10 for a semiconductor manufacturing apparatus includes gas supply sources 11a, 11b, gas introduction pipes 13a, 13b respectively connected to the gas supply sources 11a, 11b, a main gas pipe 15 into which the gas introduction pipes 13a, 13b converge, branch pipes 21a, 21b branching off the main gas pipe 15 and respectively connected to processing reactors (chambers) 27a, 27b, and a pressure type flow controller 30 comprehensively provided for the main gas pipe 15 and the branch pipes 21a, 21b.

The gas supply source 11a may be exemplified by an inert gas supply source, and the gas supply source 11b may be exemplified by a processing gas supply source.

The gas introduction pipes 13a, 13b from the gas supply sources 11a, 11b are provided with gas supply valves 12a, 12b, respectively, and the branch pipes 21a, 21b are provided with on-off valves 24a, 24b, respectively.

The pressure type flow controller 30 will now be described in detail with reference to FIG. 7. As shown in FIG. 7, the pressure type flow controller 30 includes a pressure detector 17 provided in the main gas pipe 15, control valves 23a, 23b respectively provided in the branch pipes 21a, 21b, orifices 22a, 22b respectively provided downstream of the control valves 23a, 23b, and a control circuit 30A for driving and controlling the control valves 23a, 23b based on a detected pressure $P_1$ from the pressure detector 17. The orifices 22a, 22b may be provided upstream of the control valves 23a, 23b.

The main gas pipe 15 is provided with a flow regulator 16 disposed upstream of the pressure detector 17, and a temperature detector 18 disposed downstream of the pressure detector 17.

The structure of the control circuit 30A of the pressure type flow controller 30 is the same as that shown in FIG. 6.

As shown in FIG. 6, the arithmetic control circuit 58, besides driving and controlling the control valves 23a, 23b, may also control the flow regulator 16 to regulate the pressure and the flow rate in the main gas pipe 15.

The operation of the thus-constructed gas supply apparatus of this embodiment will now be described.

Different gasses are respectively supplied from the gas supply sources 11a, 11b to the gas introduction pipes 13a, 13b, and the gases in the gas introduction pipes 13a, 13b are introduced into the main gas pipe 15 and meet there. The mixed gas in the main gas pipe 15 passes through the flow regulator 16, the pressure detector 17 and the temperature detector 18, and flows into the branch pipes 21a, 21b.

The mixed gas introduced into the branch pipes 21a, 21b passes through the control valves 23a, 23b and the orifices 22a, 22b, and is supplied to the corresponding processing reactors (chambers) 27a, 27b.

As described above, according to this embodiment, the pressure type flow controller 30 includes the pressure detector 17; the control valves 23a, 23b provided in the branch pipes 21a, 21b; the orifices 22a, 22b provided downstream of the control valves 23a, 23b; the arithmetic circuit 40 for determining the gas flow rate from a detected pressure from the pressure detector 17; the flow rate setting circuit 52; and the arithmetic control circuit 58 for controlling the control valves 23a, 23b based on a calculated flow rate from the arithmetic circuit 40 and on a set flow rate value from the flow rate setting circuit 52. Thus, the control valves 23a, 23b and the orifices 22a, 22b can be incorporated into the pressure type flow controller 30, making it possible to make the pressure type flow controller 30 compact as a whole.

Further, installation of the single pressure type flow controller 30 suffices for the processing reactors 27a, 27b. This can reduce the production cost of the gas supply apparatus.

Furthermore, because the pressure in the branch pipes 21a, 21b, lying between the orifices 22a, 22b and the processing reactors 27a, 27b, is the secondary pressure $P_2$, there is no need to use a pressure-resistant pipe as the branch pipes 21a, 21b, and thus no increase in the production cost of the gas supply apparatus.

Third Embodiment

A gas supply apparatus according to a third embodiment of the present invention will now be described with reference to FIG. 8.

Figure 8:
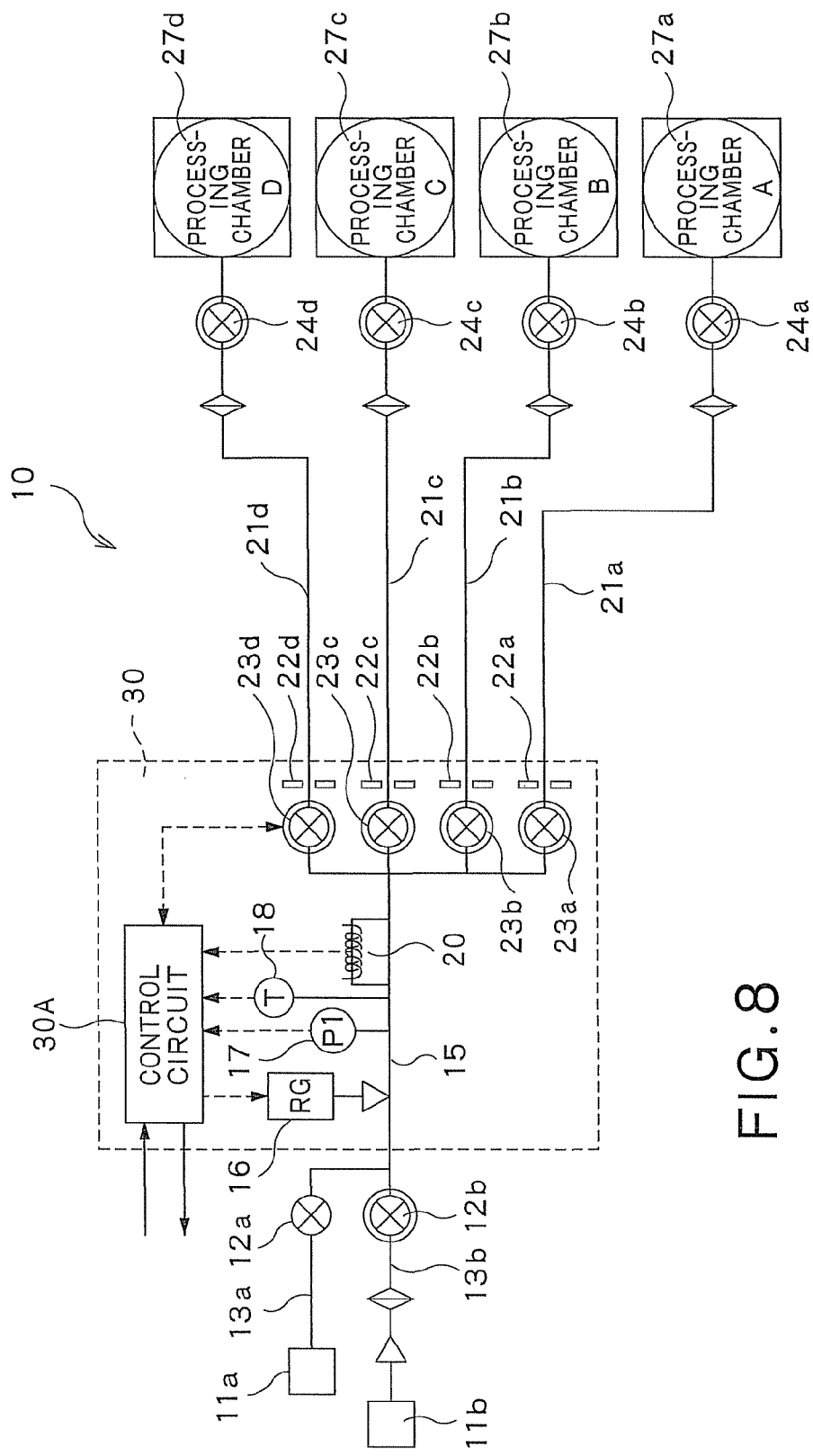
FIG. 8 is a diagram showing a gas supply apparatus for a semiconductor manufacturing apparatus according to a third embodiment of the present invention.

The third embodiment shown in FIG. 8 differs from the first embodiment shown in FIGS. 1 through 6 in that the gas supply apparatus is connected to four batch processing reactors 27a, 27b, 27c, 27d; the other construction of the third embodiment is substantially the same as the first embodiment.

The gas supply apparatus 10 for a semiconductor manufacturing apparatus includes gas supply sources 11a, 11b, gas introduction pipes 13a, 13b respectively connected to the gas supply sources 11a, 11b, a main gas pipe 15 into which the gas introduction pipes 13a, 13b converge, branch pipes 21a, 21b, 21c, 21d branching off the main gas pipe 15 and respectively connected to the processing reactors (chambers) 27a, 27b, 27c, 27d and a pressure type flow controller 30 comprehensively provided for the main gas pipe 15 and the branch pipes 21a, 21b, 21c, 21d.

The gas supply source 11a may be exemplified by an inert gas supply source, and the gas supply source 11b may be exemplified by a processing gas supply source.

The gas introduction pipes 13a, 13b from the gas supply sources 11a, 11b are provided with gas supply valves 12a, 12b, respectively, and the branch pipes 21a, 21b, 21c, 21d are provided with on-off valves 24a, 24b, 24c, 24d, respectively.

The pressure type flow controller 30 will now be described in detail with reference to FIG. 8. As shown in FIG. 8, the pressure type flow controller 30 includes a pressure detector 17 provided in the main gas pipe 15, control valves 23a, 23b, 23c, 23d respectively provided in the branch pipes 21a, 21b, 21c, 21d, orifices 22a, 22b, 22c, 22d respectively provided downstream of the control valves 23a, 23b, 23c, 23d, and a control circuit 30A for driving and controlling the control valves 23a, 23b, 23c, 23d based on a detected pressure $P_1$ from the pressure detector 17.

The main gas pipe 15 is provided with a flow regulator 16 disposed upstream of the pressure detector 17, and a temperature detector 18 and a flow detecting thermal sensor 20, both disposed downstream of the pressure detector 17.

The structure of the control circuit 30A of the pressure type flow controller 30 is the same as that shown in FIG. 6.

As shown in FIG. 6, the flow rate in the main gas pipe 15 is detected by the flow detecting thermal sensor 20, and the detected flow rate is sent to the arithmetic control circuit 58.

As shown in FIG. 2, the flow velocity of a gas, passing through the orifices 22a, 22b, generally falls into the supersonic range when the primary pressure $P_1$ and the secondary pressure $P_2$ satisfy the relation: $P_1 \geq 2 \times P_2$. In this case, the flow rate of the gas in the main gas pipe 15 can be appropriately controlled by means of the above-described pressure type flow controller 30. On the other hand, when the primary pressure $P_1$ and the secondary pressure $P_2$ satisfy the relation $P_1 < 2 \times P_2$, the secondary flow velocity falls out of the supersonic range, and it is difficult to control the flow rate of the gas in the main gas pipe 15 by means of the pressure type flow controller 30.

Referring to FIG. 6, the flow rate detected by the thermal sensor 20 is sent to the arithmetic control circuit 58. When the primary pressure $P_1$ is low, such as that immediately after the start of operation, the arithmetic control circuit 58 determines that pressure type flow control is impossible, and starts the above-described pressure type flow control when the primary pressure $P_1$ and the secondary pressure $P_2$ have come to satisfy the relation $P_1 \geq 2 \times P_2$ and the secondary flow velocity has come into the supersonic range.

As shown in FIG. 6, the arithmetic control circuit 58, besides driving and controlling the control valves 23a, 23b, 23c, 23d, may also control the flow regulator 16 to regulate the pressure and the flow rate in the main gas pipe 15.

The operation of the thus-constructed gas supply apparatus of this embodiment will now be described.

Different gasses are respectively supplied from the gas supply sources 11a, 11b to the gas introduction pipes 13a, 13b, and the gases in the gas introduction pipes 13a, 13b are introduced into the main gas pipe 15 and meet there. The mixed gas in the main gas pipe 15 passes through the flow regulator 16, the pressure detector 17, the temperature detector 18 and the flow detecting thermal sensor 20, and flows into the branch pipes 21a, 21b, 21c, 21d.

The mixed gas introduced into the branch pipes 21a, 21b, 21c, 21d passes through the control valves 23a, 23b, 23c, 23d and the orifices 22a, 22b, 22c, 22d and is supplied to the corresponding processing reactors (chambers) 27a, 27b, 27c, 27d.

As described above, according to this embodiment, the pressure type flow controller 30 includes the pressure detector 17; the control valves 23a, 23b, 23c, 23d provided in the branch pipes 21a, 21b, 21c, 21d; the orifices 22a, 22b, 22c, 22d provided downstream of the control valves 23a, 23b, 23c, 23d; the arithmetic circuit 40 for determining the gas flow rate from a detected pressure from the pressure detector 17; the flow rate setting circuit 52; and the arithmetic control circuit 58 for controlling the control valves 23a, 23b, 23c, 23d based on a calculated flow rate from the arithmetic circuit 40 and on a set flow rate value from the flow rate setting circuit 52. Thus, the control valves 23a, 23b, 23c, 23d and the orifices 22a, 22b, 22c, 22d can be incorporated into the pressure type flow controller 30, making it possible to make the pressure type flow controller 30 compact as a whole.

Further, installation of the single pressure type flow controller 30 suffices for the processing reactors 27a, 27b, 27c, 27d. This can reduce the production cost of the gas supply apparatus.

Furthermore, because the pressure in the branch pipes 21a, 21b, 21c, 21d, lying between the orifices 22a, 22b, 22c, 22d and the processing reactors 27a, 27b, 27c, 27d, is the secondary pressure $P_2$, there is no need to use a pressure-resistant pipe as the branch pipes 21a, 21b, 21c, 21d, and thus no increase in the production cost of the gas supply apparatus.

Fourth Embodiment

A gas supply apparatus according to a fourth embodiment of the present invention will now be described with reference to FIGS. 9(a) through 9(c).

In the fourth embodiment shown in FIGS. 9(a) through 9(c), the gas supply apparatus is connected to four processing reactors (chambers) 27a, 27b, 27c, 27d which may be cluster-type single-wafer processing reactors.

The four processing reactors 27a, 27b, 27c, 27d are disposed around a transport module (TM) 61 which is connected to a loading/unloading section 63 via a load lock module (LLM) 62.

Further, the pressure type flow controller 30 has an electricity/air pressure regulator 30B.

The other construction of the fourth embodiment shown in FIGS. 9(a) through 9(c) is substantially the same as the first embodiment shown in FIGS. 1 through 6.

The gas supply apparatus 10 for a semiconductor manufacturing apparatus includes gas supply sources 11a, 11b, gas introduction pipes 13a, 13b respectively connected to the gas supply sources 11a, 11b, a main gas pipe 15 into which the gas introduction pipes 13a, 13b converge, branch pipes 21a, 21b, 21c, 21d branching off the main gas pipe 15 and respectively connected to the processing reactors (chambers) 27a, 27b, 27c, 27d and a pressure type flow controller 30 comprehensively provided for the main gas pipe 15 and the branch pipes 21a, 21b, 21c, 21d.

The gas supply source 11a may be exemplified by an inert gas supply source, and the gas supply source 11b may be exemplified by a processing gas supply source.

The processing reactors 27a, 27b, 27c, 27d shown in FIGS. 9(a) through 9(c) may be cluster-type single-wafer processing reactors (including short batch processing reactors).

The gas introduction pipes 13a, 13b from the gas supply sources 11a, 11b are provided with gas supply valves 12a, 12b, respectively.

Figure 9:
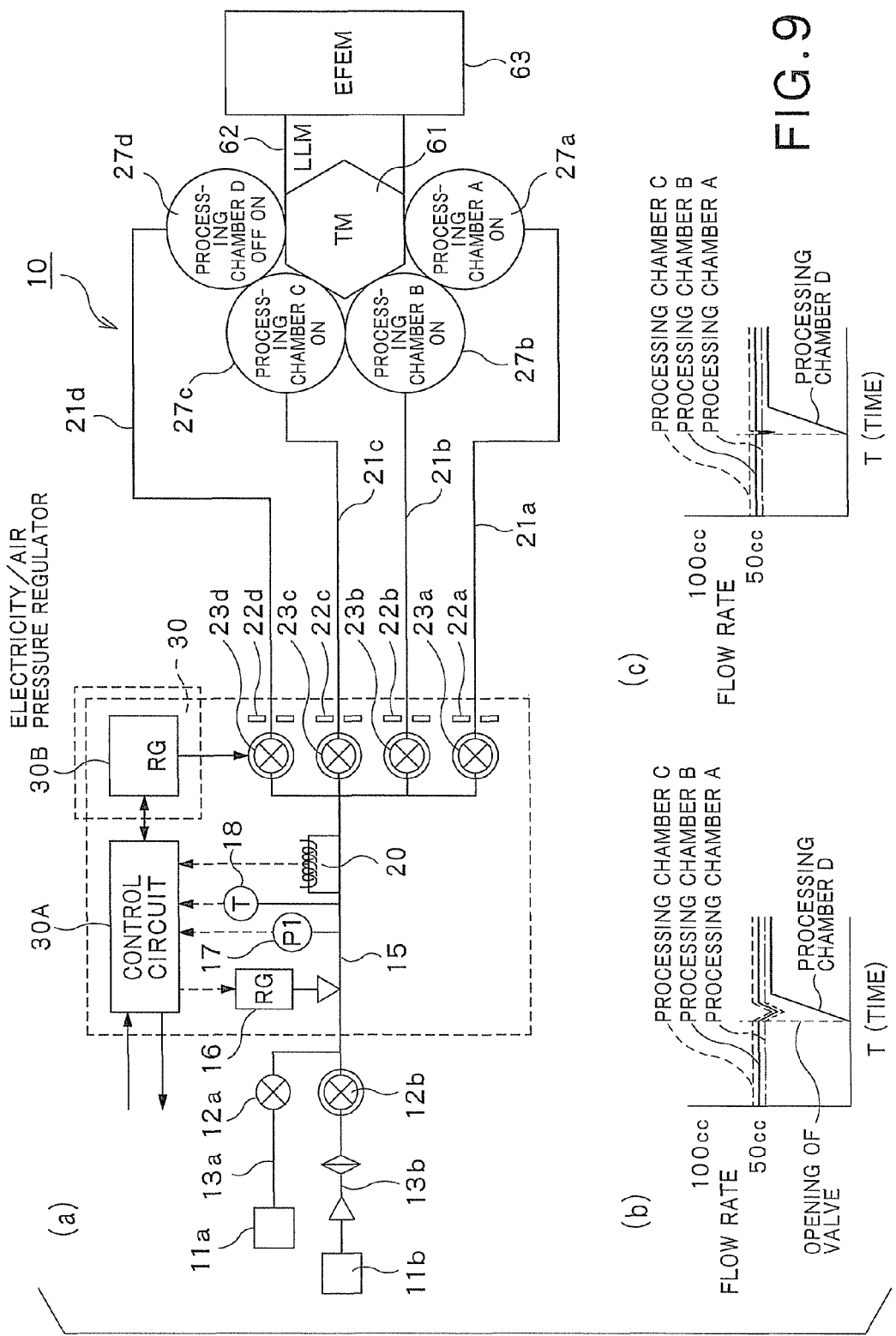
FIGS. 9(a) though 9(C) are diagrams showing a gas supply apparatus for a semiconductor manufacturing apparatus according to a fourth embodiment of the present invention.

The pressure type flow controller 30 will now be described in detail with reference to FIG. 9. As shown in FIG. 9, the pressure type flow controller 30 includes a pressure detector 17 provided in the main gas pipe 15, control valves 23a, 23b, 23c, 23d respectively provided in the branch pipes 21a, 21b, 21c, 21d, orifices 22a, 22b, 22c, 22d respectively provided downstream of the control valves 23a, 23b, 23c, 23d, and a control circuit 30A for driving and controlling through the electricity/air pressure regulator 30B the control valves 23a, 23b, 23c, 23d based on a detected pressure $P_1$ from the pressure detector 17.

The main gas pipe 15 is provided with a flow regulator 16 disposed upstream of the pressure detector 17, and a temperature detector 18 and a flow detecting thermal sensor 20, both disposed downstream of the pressure detector 17.

As shown in FIG. 6, the flow rate in the main gas pipe 15 is detected by the flow detecting thermal sensor 20, and the detected flow rate is sent to the arithmetic control circuit 58.

As shown in FIG. 2, the flow velocity of a gas, passing through the orifices 22a, 22b, generally falls into the supersonic range when the primary pressure $P_1$ and the secondary pressure $P_2$ satisfy the relation: $P_1 \geq 2 \times P_2$. In this case, the flow rate of the gas in the main gas pipe 15 can be appropriately controlled by means of the above-described pressure type flow controller 30. On the other hand, when the primary pressure $P_1$ and the secondary pressure $P_2$ satisfy the relation $P_1 < 2 \times P_2$, the secondary flow velocity falls out of the supersonic range, and it is difficult to control the flow rate of the gas in the main gas pipe 15 by means of the pressure type flow controller 30.

Referring to FIG. 6, the flow rate detected by the thermal sensor 20 is sent to the arithmetic control circuit 58. When the primary pressure $P_1$ is low, such as that immediately after the start of operation, the arithmetic control circuit 58 determines that pressure type flow control is impossible, and starts the above-described pressure type flow control when the primary pressure $P_1$ and the secondary pressure $P_2$ have come to satisfy the relation $P_1 \geq 2 \times P_2$ and the secondary flow velocity has come into the supersonic range.

As shown in FIG. 6, the arithmetic control circuit 58, besides driving and controlling the control valves 23a, 23b, 23c, 23d, may also control the flow regulator 16 to regulate the pressure and the flow rate in the main gas pipe 15.

The operation of the thus-constructed gas supply apparatus of this embodiment will now be described.

Different gasses are respectively supplied from the gas supply sources 11a, 11b to the gas introduction pipes 13a, 13b, and the gases in the gas introduction pipes 13a, 13b are introduced into the main gas pipe 15 and meet there. The mixed gas in the main gas pipe 15 passes through the flow regulator 16, the pressure detector 17, the temperature detector 18 and the flow detecting thermal sensor 20, and flows into the branch pipes 21a, 21b, 21c, 21d.

The mixed gas introduced into the branch pipes 21a, 21b, 21c, 21d passes through the control valves 23a, 23b, 23c, 23d and the orifices 22a, 22b, 22c, 22d and is supplied to the corresponding processing reactors (chambers) 27a, 27b, 27c, 27d.

As described above, according to this embodiment, the pressure type flow controller 30 includes the pressure detector 17; the control valves 23a, 23b, 23c, 23d provided in the branch pipes 21a, 21b, 21c, 21d; the orifices 22a, 22b, 22c, 22d provided downstream of the control valves 23a, 23b, 23c, 23d; the arithmetic circuit 40 for determining the gas flow rate from a detected pressure from the pressure detector 17; the flow rate setting circuit 52; and the arithmetic control circuit 58 for controlling the control valves 23a, 23b, 23c, 23d based on a calculated flow rate from the arithmetic circuit 40 and on a set flow rate value from the flow rate setting circuit 52. Thus, the control valves 23a, 23b, 23c, 23d and the orifices 22a, 22b, 22c, 22d can be incorporated into the pressure type flow controller 30, making it possible to make the pressure type flow controller 30 compact as a whole.

Further, installation of the single pressure type flow controller 30 suffices for the processing reactors 27a, 27b, 27c, 27d. This can reduce the production cost of the gas supply apparatus.

Furthermore, because the pressure in the branch pipes 21a, 21b, 21c, 21d, lying between the orifices 22a, 22b, 22c, 22d and the processing reactors 27a, 27b, 27c, 27d, is the secondary pressure $P_2$, there is no need to use a pressure-resistant pipe as the branch pipes 21a, 21b, 21c, 21d, and thus no increase in the production cost of the gas supply apparatus.

As shown in FIGS. 9(b) and 9(c), when starting the operation of the processing reactor 27d after keeping it in a standby condition while operating the other processing reactors 27a to 27c, the control valve 23d needs to be opened. It is possible that when the valve 23d is opened, due to a pressure drop in the main gas pipe 15, a pulsation may occur in the flow rate of the gas supplied to the processing reactors 27a to 27c (FIG. 9(b)).

According to this embodiment, the control circuit 30A drives and opens/closes the control valves 23a to 23d through the electricity/air pressure regulator 30B. This enables gentle movement of the control valves 23a to 23d, making it possible to prevent a pulsation in the flow rate of the gas supplied to the processing reactors 27a to 27d.

Fifth Embodiment

A gas supply apparatus according to a fifth embodiment of the present invention will now be described with reference to FIG. 10.

Figure 10:
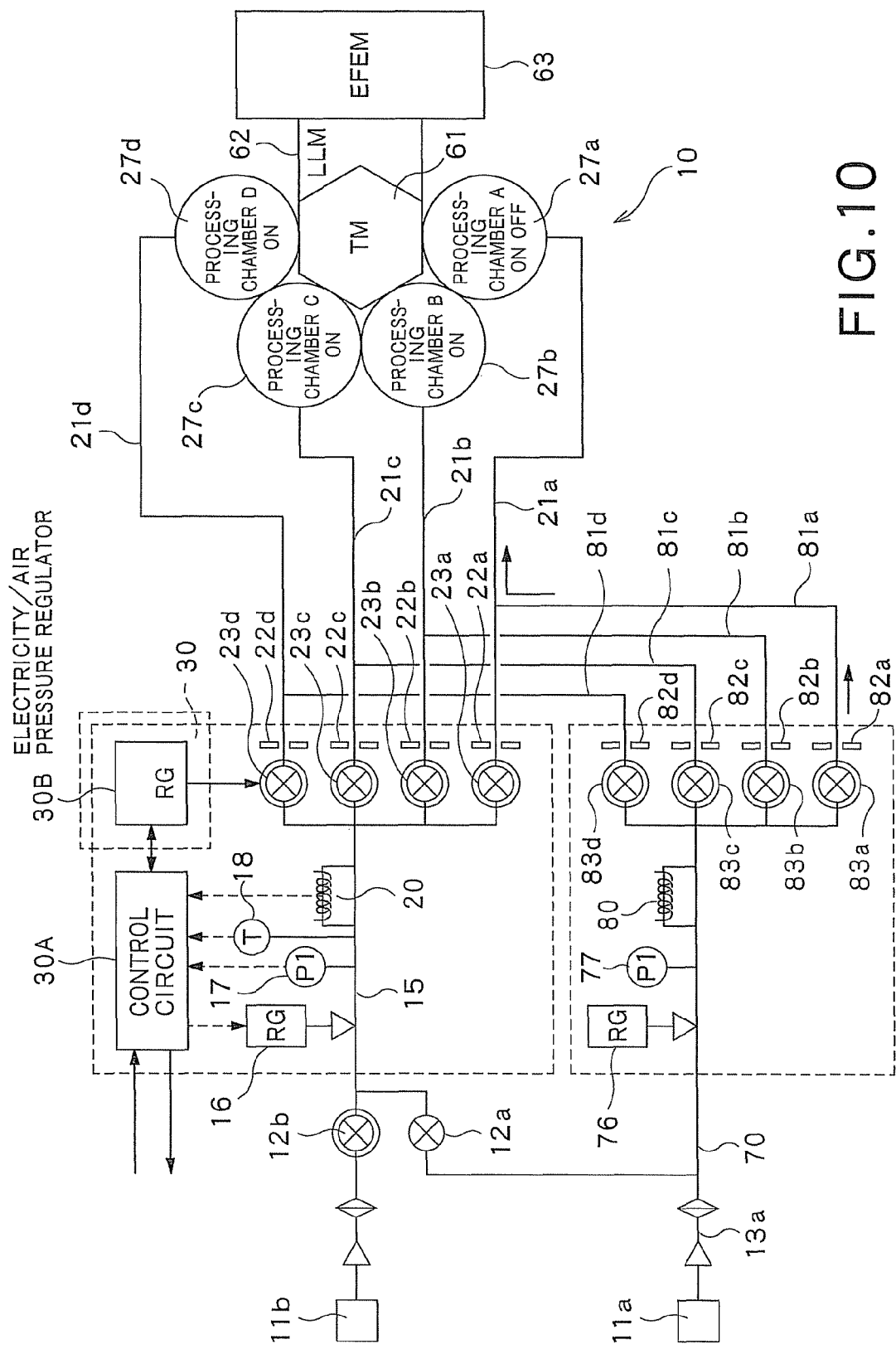
FIG. 10 is a diagram showing a gas supply apparatus for a semiconductor manufacturing apparatus according to a fifth embodiment of the present invention.

In the fifth embodiment shown in FIG. 10, a bypass pipe 70 is connected to a gas introduction pipe extended from a gas supply source ($N_2$ gas supply source) 11a, and the bypass pipe is connected to branch pipes 21a, 21b, 21c, 21d via communication pipes 81a, 81b, 81c, 81d, respectively.

The bypass pipe 70 is provided with an additional flow regulator 76, an additional pressure detector 77 and an additional flow detecting thermal sensor 80, and the communication pipes 81a, 81b, 81c, 81d are provided with additional control valves 83a, 83b, 83c, 83d and additional orifices 82a, 82b, 82c, 82d, respectively.

The other construction of the fifth embodiment is substantially the same as the fourth embodiment shown in FIGS. 9(a) through 9(c).

The gas supply apparatus 10 for a semiconductor manufacturing apparatus includes gas supply sources 11a, 11b, gas introduction pipes 13a, 13b respectively connected to the gas supply sources 11a, 11b, a main gas pipe 15 into which the gas introduction pipes 13a, 13b converge, branch pipes 21a, 21b, 21c, 21d branching off the main gas pipe 15 and respectively connected to the processing reactors (chambers) 27a, 27b, 27c, 27d and a pressure type flow controller 30 comprehensively provided for the main gas pipe 15 and the branch pipes 21a, 21b, 21c, 21d.

The gas supply source 11a may be exemplified by an inert gas supply source, and the gas supply source 11b may be exemplified by a processing gas supply source.

The gas introduction pipes 13a, 13b from the gas supply sources 11a, 11b are provided with gas supply valves 12a, 12b, respectively.

The pressure type flow controller 30 will now be described in detail with reference to FIG. 10. As shown in FIG. 10, the pressure type flow controller 30 includes a pressure detector 17 provided in the main gas pipe 15, control valves 23a, 23b, 23c, 23d respectively provided in the branch pipes 21a, 21b, 21c, 21d, orifices 22a, 22b, 22c, 22d respectively provided downstream of the control valves 23a, 23b, 23c, 23d, and a control circuit 30A for driving and controlling through an electricity/air pressure regulator 30B the control valves 23a, 23b, 23c, 23d based on a detected pressure $P_1$ from the pressure detector 17.

The main gas pipe 15 is provided with a flow regulator 16 disposed upstream of the pressure detector 17, and a temperature detector 18 and a flow detecting thermal sensor 20, both disposed downstream of the pressure detector 17.

As shown in FIG. 6, the flow rate in the main gas pipe 15 is detected by the flow detecting thermal sensor 20, and the detected flow rate is sent to the arithmetic control circuit 58.

As shown in FIG. 2, the flow velocity of a gas, passing through the orifices 22a, 22b, generally falls into the supersonic range when the primary pressure $P_1$ and the secondary pressure $P_2$ satisfy the relation: $P_1 \geq 2 \times P_2$. In this case, the flow rate of the gas in the main gas pipe 15 can be appropriately controlled by means of the above-described pressure type flow controller 30. On the other hand, when the primary pressure $P_1$ and the secondary pressure $P_2$ satisfy the relation $P_1 < 2 \times P_2$, the secondary flow velocity falls out of the supersonic range, and it is difficult to control the flow rate of the gas in the main gas pipe 15 by means of the pressure type flow controller 30.

Referring to FIG. 6, the flow rate detected by the thermal sensor 20 is sent to the arithmetic control circuit 58. When the primary pressure $P_1$ is low, such as that immediately after the start of operation, the arithmetic control circuit 58 determines that pressure type flow control is impossible, and starts the above-described pressure type flow control when the primary pressure $P_1$ and the secondary pressure $P_2$ have come to satisfy the relation $P_1 \geq 2 \times P_2$ and the secondary flow velocity has come into the supersonic range.

As shown in FIG. 6, the arithmetic control circuit 58, besides driving and controlling the control valves 23a, 23b, 23c, 23d, may also control the flow regulator 16 to regulate the pressure and the flow rate in the main gas pipe 15.

The operation of the thus-constructed gas supply apparatus of this embodiment will now be described.

Different gasses are respectively supplied from the gas supply sources 11a, 11b to the gas introduction pipes 13a, 13b, and the gases in the gas introduction pipes 13a, 13b are introduced into the main gas pipe 15 and meet there. The mixed gas in the main gas pipe 15 passes through the flow regulator 16, the pressure detector 17, the temperature detector 18 and the flow detecting thermal sensor 20, and flows into the branch pipes 21a, 21b, 21c, 21d.

The mixed gas introduced into the branch pipes 21a, 21b, 21c, 21d passes through the control valves 23a, 23b, 23c, 23d and the orifices 22a, 22b, 22c, 22d and is supplied to the corresponding processing reactors (chambers) 27a, 27b, 27c, 27d.

As described above, according to this embodiment, the pressure type flow controller 30 includes the pressure detector 17; the control valves 23a, 23b, 23c, 23d provided in the branch pipes 21a, 21b, 21c, 21d; the orifices 22a, 22b, 22c, 22d provided downstream of the control valves 23a, 23b, 23c, 23d; the arithmetic circuit 40 for determining the gas flow rate from a detected pressure from the pressure detector 17; the flow rate setting circuit 52; and the arithmetic control circuit 58 for controlling the control valves 23a, 23b, 23c, 23d based on a calculated flow rate from the arithmetic circuit 40 and on a set flow rate value from the flow rate setting circuit 52. Thus, the control valves 23a, 23b, 23c, 23d and the orifices 22a, 22b, 22c, 22d can be incorporated into the pressure type flow controller 30, making it possible to make the pressure type flow controller 30 compact as a whole.

Further, installation of the single pressure type flow controller 30 suffices for the processing reactors 27a, 27b, 27c, 27d. This can reduce the production cost of the gas supply apparatus.

Furthermore, because the pressure in the branch pipes 21a, 21b, 21c, 21d, lying between the orifices 22a, 22b, 22c, 22d and the processing reactors 27a, 27b, 27c, 27d, is the secondary pressure $P_2$, there is no need to use a pressure-resistant pipe as the branch pipes 21a, 21b, 21c, 21d, and thus no increase in the production cost of the gas supply apparatus.

According to this embodiment, the control circuit 30A drives and opens/closes the control valves 23a to 23d through the electricity/air pressure regulator 30B. This enables gentle movement of the control valves 23a to 23d, making it possible to prevent a pulsation in the flow rate of the gas supplied to the processing reactors 27a to 27d.

Referring to FIG. 10, the control valves 23a to 23d are open and the additional control valves 82a to 82d are closed during the operation of the processing reactors 27a to 27d. When stopping only the processing reactor 27a, the pressure type flow controller 30 closes the control valve 23a, and then opens only the additional control valve 82a while keeping the additional control valves 82b to 82d closed, so that $N_2$ gas can be introduced from the gas supply source 11a into the processing reactor 27a via the bypass pipe 70 and the communication pipe 81a.

As with the control valves 23a to 23d, the additional control valves 82a to 82d may be provided with a pressure type flow controller 30 which drives and controls the valves. The additional control valves 82a to 82d may also be controlled by means of a not-shown controller based on a signal from the additional thermal sensor 80.

What is claimed is:

1. A gas supply apparatus for supplying a gas to a plurality of processing reactors of a semiconductor manufacturing apparatus, comprising:
    a plurality of gas supply sources;
    gas introduction pipes respectively connected to the gas supply sources;
    a main gas pipe into which the gas introduction pipes converge;
    branch pipes branching off the main gas pipe and respectively connected to the processing reactors; and
    a pressure type flow controller provided for the main gas pipe and the branch pipes, wherein the pressure type flow controller includes a pressure detector, a temperature sensor and a flow detecting thermal sensor provided in the main gas pipe, a control valve provided in each of the branch pipes, an orifice provided downstream or upstream of the control valve in each of the branch pipes, a first arithmetic circuit for determining a flow rate $Qc=KP_1$ (K is a constant) from a detected pressure $P_1$ from the pressure detector, a flow rate setting circuit for outputting a set flow rate signal of each of the branch pipes Qs, and an arithmetic control circuit for controlling the control valve of each of the branch pipes based on the flow rate Qc from the arithmetic circuit and on the set flow rate signal Qs from the flow rate setting circuit, wherein the pressure $P_1$ on the upstream side of the orifice and the pressure $P_2$ on the downstream side of the orifice satisfy the relation $P_1 \geq 2 \times P_2$, and the temperature sensor and the flow detecting thermal sensor each provide a signal to the arithmetic control unit.

2. The gas supply apparatus according to claim 1, wherein the arithmetic control circuit determines whether the flow velocity of the gas passing through the orifice falls within the supersonic range.

3. The gas supply apparatus according to claim 1, wherein a bypass pipe is connected to the gas introduction pipe of a particular gas supply source of the plurality of gas supply sources, and the bypass pipe and each of the branch pipes are connected by a communication pipe.

4. The gas supply apparatus according to claim 1, wherein the processing reactors are cluster-type single-wafer processing reactors.

5. The gas supply apparatus according to claim 1, wherein the processing reactors are batch processing reactors.

6. The gas supply apparatus according to claim 1, wherein the pressure type flow controller further includes an electricity/air pressure regulator provided between the arithmetic control circuit and the control valves.

\* \* \* \* \*